(12) United States Patent
Zhang

(10) Patent No.: US 10,347,991 B2
(45) Date of Patent: Jul. 9, 2019

(54) ORTHOGONALLY POLARIZED DUAL FREQUENCY CO-AXIALLY STACKED PHASED-ARRAY PATCH ANTENNA APPARATUS AND ARTICLE OF MANUFACTURE

(71) Applicant: Ce Zhang, Pasadena, CA (US)

(72) Inventor: Ce Zhang, Pasadena, CA (US)

(73) Assignees: TUBIS TECHNOLOGY, INC., Pasadena, CA (US); KACST, Riyadh (SA)

( * ) Notice: Subject to any disclaimer, the term of this patent is extended or adjusted under 35 U.S.C. 154(b) by 387 days.

(21) Appl. No.: 15/149,151

(22) Filed: May 8, 2016

(65) Prior Publication Data

US 2017/0352960 A1 Dec. 7, 2017

(51) Int. Cl.
*H01Q 9/04* (2006.01)
*H01Q 21/06* (2006.01)
*H01Q 9/06* (2006.01)
*H01Q 3/26* (2006.01)
*G02F 1/1335* (2006.01)
*H01Q 1/28* (2006.01)

(52) U.S. Cl.
CPC ......... *H01Q 9/0464* (2013.01); *H01Q 9/0492* (2013.01); *H01Q 21/06* (2013.01); *H01Q 21/065* (2013.01); *G02F 2001/133541* (2013.01); *H01Q 1/288* (2013.01); *H01Q 3/2682* (2013.01); *H01Q 9/065* (2013.01); *H05K 2201/09109* (2013.01)

(58) Field of Classification Search
CPC .... H01Q 9/0464; H01Q 9/0492; H01Q 21/06; H01Q 21/065; H01Q 1/288; H01Q 3/2682; H01Q 9/065; G02F 2001/133541; H05K 2201/09109
See application file for complete search history.

(56) References Cited

U.S. PATENT DOCUMENTS

| | | | | |
|---|---|---|---|---|
| 9,184,504 B2 * | 11/2015 | Tatarnikov | ........... | H01Q 9/0464 |
| 2008/0136734 A1 * | 6/2008 | Manholm | ............ | H01Q 9/0414 343/893 |
| 2010/0060535 A1 * | 3/2010 | Tiezzi | .................. | H01Q 1/3275 343/770 |
| 2013/0241783 A1 * | 9/2013 | Rao | ........................ | H01Q 21/30 343/725 |
| 2013/0342409 A1 * | 12/2013 | Tatarnikov | ............. | H01Q 21/28 343/729 |

* cited by examiner

*Primary Examiner* — Hai V Tran
*Assistant Examiner* — Awat M Salih
(74) *Attorney, Agent, or Firm* — PATENTRY; Peter G. H. Hwang

(57) ABSTRACT

A planar multi-layer assembly method fabricates a dual frequency, dual polarization phased-array antenna. A plurality of vias make up an array of double-walled wells which are connected to a ground plane. A shorted annular ring patch antenna (SARPA) is deposited at the top of each double-walled well. Fabricated coaxially and parallel to each SARPA, is an array of circular patch antennas (CPA). The inner wall of each double-walled well improves isolation of the CPA signals from the SARPA signals. Each SARPA of the array is connected to a pair of first frequency band signal vias and the CPA is coupled to a pair of second frequency band signal vias. Within each frequency band, a plurality of signal phases enable steerable polarized antenna beams.

10 Claims, 9 Drawing Sheets

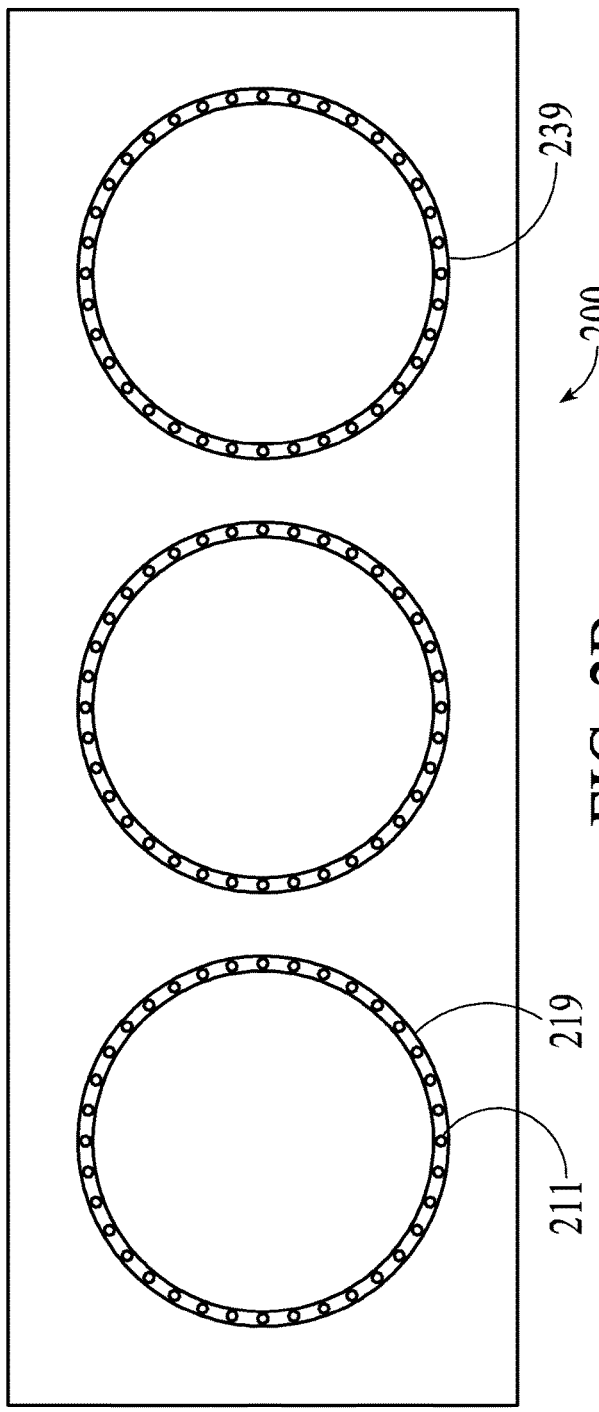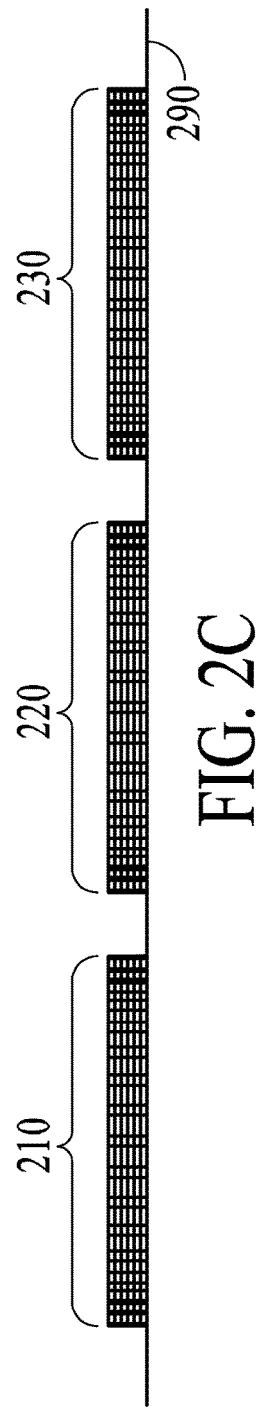
FIG. 2B
FIG. 2C

ORTHOGONALLY POLARIZED DUAL FREQUENCY CO-AXIALLY STACKED PHASED-ARRAY PATCH ANTENNA APPARATUS AND ARTICLE OF MANUFACTURE

CROSS-REFERENCE TO RELATED APPLICATIONS

None

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISK OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

Technical Field

A phased-array Ka band satellite antenna is disclosed.

Conventional Ka band antennas are useful for both commercial and governmental applications. Both entertainment and security require much higher bandwidth and lower cost.

What is needed is a switchable circular polarization. What is needed is a lower cost dielectric material for equivalent performance. What is needed is higher performance improvement for Ka band phased array satellite communication without higher cost dielectric substrate material.

BRIEF SUMMARY OF THE DISCLOSURE

A phased-array antenna is fabricated using planar multi-layer manufacturing. Each antenna element is made of two co-axial antenna patches which occupy different layers of the dielectric substrate. One patch is circular and the other is annular. Each patch drives or is driven by a pair of signal vias to support switchable polarization.

An article of manufacture benefits from planar multi-layer assembly methods to fabricate a dual frequency, dual polarization phased antennae array.

A plurality of vias make up wells which are electrically connected to a ground plane.

A shorted annular ring patch antenna (SARPA) is fabricated by depositing a low resistance metal conductor on a dielectric layer at the top of each well.

Elevated above each SARPA by another dielectric layer, fabricated coaxially and parallel to the SARPA, is a circular patch antenna (CPA).

There are also two hybrid couplers per cell of the design each corresponding to one patch antenna. Each hybrid coupler has four ports: two are input ports routed to the radio frequency integrated circuitries (RFIC); the other two ports are routed to the two signal vias of the top/bottom patch. The hybrid coupler generates two signals at the two output ports from the signal out of RFIC if only one input port is ON. When one input port is ON, the two output ports have +90 degree phase shift; while, when the other input port is ON, the two output ports have −90 degree phase shift. The two output signals with phase shift connected to the two signal vias generates two orthogonal electric fields with +/−90 degree phase shift. The superposition of these two phase shifted orthogonal electric fields leads to the circular polarized electric field. The left/right handedness of the radiated electric field is dependent on the sign of 90 degree phase shift (i.e. which input port is ON).

The inner wall of the double-walled well is connected to the interior edge of the SARPA.

In an embodiment, the SARPA is connected to the lower frequency band vias and the CPA is connected to the upper frequency band vias.

The invention can also be understood as the combination of an array of shorted annular ring patch antennae and an array of circular patch antennae which are arranged to be co-axial at different levels of a dielectric substrate. An article of manufacture includes multiple strata of dielectric material fabricated as layers, each with voids and conductive film, and finally integrated into a planar multi-layer array of antenna elements.

The assembled article in top view arranges the annular patches and circular patches coaxially.

The annulus has two radius: inner radius a and outer radius b. The average (a+b)/2 is related to the operating frequency of the lower band antenna (annular antenna).

The invention stacks up the two antenna at different bands to reduce the spacing between units (wherein a group of an upper band and a lower band antenna is a unit). The spacing determines the isolation between units, which has to be lower than a certain value in order to satisfy the system specs of phased array antenna. In a conventional antenna, the two antennas (upper and lower band antenna) are fabricated on the same horizontal plane. In this application, the fabrication stacks them coaxially to reduce the occupied area in the horizontal dimensions. In this way, to reach the same level of isolation, the spacing can be smaller. This allows use of a low dielectric constant material, which is additionally more economical.

Because the spacing is also related to the scanning angle, the closer spacing results in wider scanning angle.

The article also has a hybrid strata (Hstrata) of layers.

The Hstrata of layers physically connects a first pair of upper band signals and a second pair of lower band signals to the plurality of signal vias.

BRIEF DESCRIPTION OF THE DRAWINGS

The foregoing and other objects, aspects, features, and advantages of the disclosure will become more apparent and better understood by referring to the following description taken in conjunction with the accompanying drawings, in which:

FIGS. 2A, 2B, and 2C are views of a ground plane connected to a plurality of via which form ground walls and an array of ground wells;

DETAILED DESCRIPTION

Figure 1:
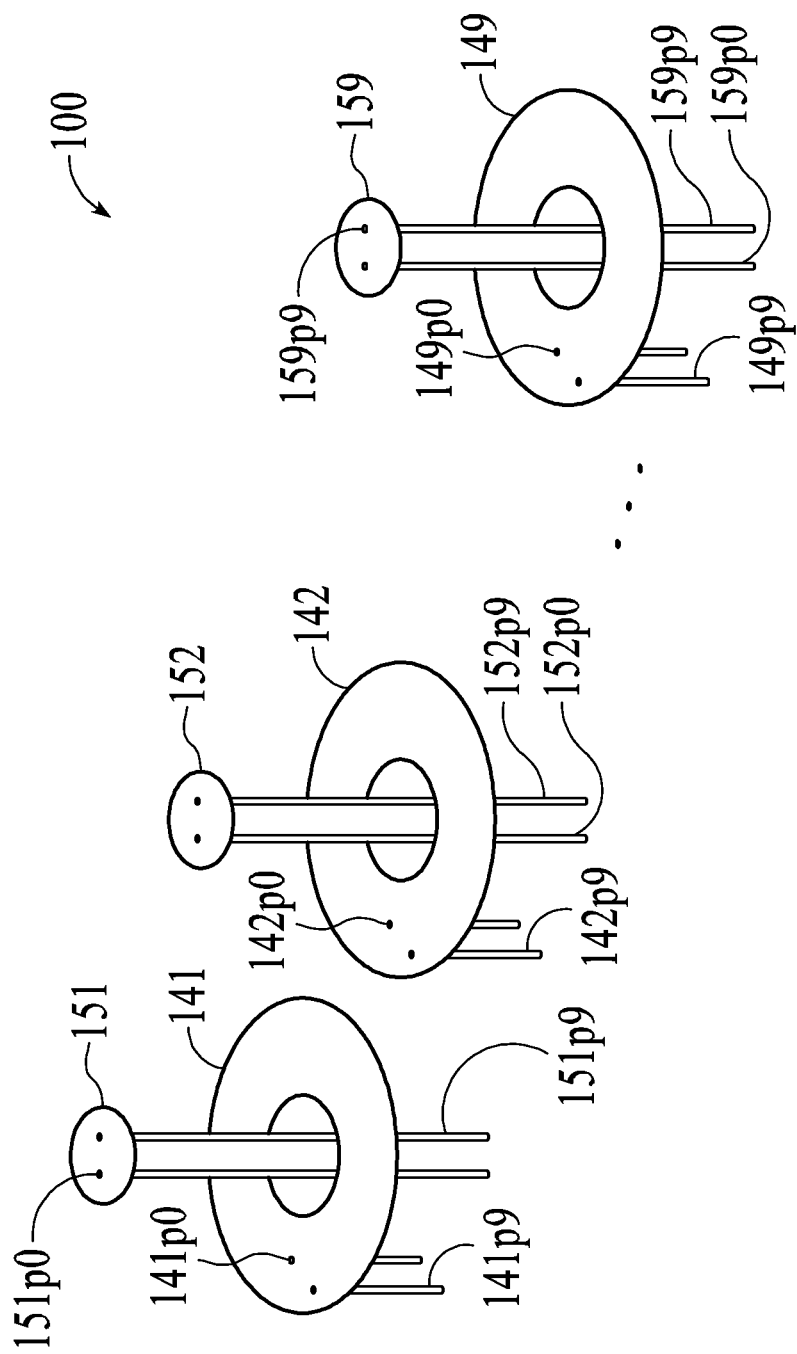
FIG. 1 is a perspective drawing of an array of antenna patches and signal via.

An article of manufacture benefits from planar multi-layer assembly methods to fabricate a dual frequency, dual polarization phased-array.

Penetrating multiple layers of dielectric, a plurality of vias make up a conductive well wall connected to a ground plane.

In an embodiment, a plurality of vias make up a double-walled well which is connected to a ground plane.

A shorted annular ring patch antenna (SARPA) is fabricated by depositing a low resistance metal conductor on a dielectric layer at the top of the well.

Elevated above the SARPA by another dielectric layer, fabricated coaxially and parallel to the SARPA, is a circular patch antenna (CPA).

The inner wall of the double-walled well is physically connected to the interior edge of the SARPA.

The inner arc of annular ring patch is optionally shorted to ground for the additional benefit of better isolation of the feeding vias of upper patch.

In principle, if two linear polarization has +90 or −90 degree phase shift, the result is circular polarization. Although there are many ways to generate the circular polarization at TM11 mode with a single feed via, the dual feed vias have the advantage of achieving wider axial ratio bandwidth. The circular polarization is evaluated by the axial ratio, i.e., how close the magnitudes of the two orthogonal (90 degree shifted) fields are. Moreover, since the desired system requires polarization (LHCP or RHCP) switching, a conventional single feed via cannot implement the essential function (because the polarization of single feed via design is determined by the location of the via and the physical geometry of the patch).

An annular ring patch (the lower patch) also works in the same way as circular patch when it is working in the mode of TM11 mode which has linear polarization with a single feed via. In this disclosure, the dual feed vias enable switchable generation of two linear polarization fields with 90 degree phase shift. The +90 degree or the −90 degree can generate the left handed circular polarization (LHCP) and right handed circular polarization (RHCP) respectively (this correspondence may be reversed depending on the choice of the feed vias).

Advantageously, The integrated use of an array of top (circular) and an array of bottom (shorted annular ring) patches is novel for the Ka band phased array satellite communication. The organization of the via walls with the top and bottom patches provides a great performance when the substrate of low dielectric constant is required to cut the fabrication cost.

The inner arc of annular ring patches are optionally shorted to ground because the shorting vias don't affect the operation of this lower patch. However, it has the additional benefit of offering better isolation of the feeding vias of upper patch.

One aspect of the invention is an article of manufacture including a plurality of dielectric layers having voids filled with conductive metal to form vias, and surface patterns of conductive metal film to form ground planes and patches, comprising: a first plurality of dielectric layers having metal filed voids (ground vias) which when assembled penetrate said first layers to form a substantially radio frequency (rf) conductive well wall; a metal film portion of a shorted annular ring patch antenna (SARPA) coaxially arranged within the horizontal boundary of each rf conductive well wall (well) and at the upper surface of the wells; a second plurality of dielectric layers having metal filed voids (signal vias) assembled above the SARPA; and a metal film portion of a circular patch antenna (CPA) on the upper surface of the second plurality dielectric layers.

In an embodiment, the first plurality of dielectric layers having metal filed voids (ground vias) when assembled penetrates said first layers to form a substantially radio frequency (rf) conductive well wall is further physically connected to a metal film ground plane. Said ground plane having non-conductive voids through which signal vias pass.

In an embodiment, the shorted annular ring patch antenna (SARPA) coaxially arranged within the horizontal boundary of the rf conductive well wall (well) and at the upper surface of the well comprises: a first plurality of signal vias; connected to, an annular metal film surface.

In an embodiment, a second plurality of dielectric layers having metal filed voids (signal vias) assembled above the SARPA is further physically connected to signal vias penetrating the first plurality of layers and through the ground plane.

In an embodiment, the circular patch antenna (CPA) on the upper surface of the second plurality dielectric layers comprises: a second plurality of signal vias; connected to, a circular metal film surface isolated by the second plurality of layers and elevated above the metal film portion of the SARPA.

In an embodiment, the invention also has a second plurality of metal filled voids in said dielectric layers which forms a second conductive well wall physically connected to the ground plane. The ground plane is also physically connected to the inner edge of the shorted annular ring patch antenna.

In an embodiment, there are two hybrid couplers corresponding to each patch antenna. Two hybrid couplers sandwiched by the middle ground plane and bottom ground plane are connected to the input of transmitter and receiver RFIC.

In an embodiment, the input port of hybrid coupler circuit is switchable using the RF switch in RFIC.

Another aspect of the invention is an article of manufacture having a plurality of strata of dielectric material fabricated as layers, each layer fabricated with voids and conductive film, and finally integrated into a planar multi-layer array of antenna elements, wherein: said article comprises an understrata of layers made of dielectric material with voids for a plurality of ground vias and a plurality of signal vias. The thickness between the conductive patch structures (either the top circular or the bottom annular ring antenna) and the conductive ground plane determines the maximum range of the operating frequency of the corresponding bands (upper/lower band of radio frequency signal). In an embodiment, the first layer of the understrata is a first antenna patch layer and a first surface pattern of conductive film applied forming an annulus physically connected to a pair of signal vias. The invention has two hybrid couplers and their two input ports are connected to the two outputs from transmit and receive RFIcs.

In an embodiment, the last layer of the understrata is the bed layer and has a second surface pattern of conductive film applied to interconnect the ground vias in a ground plane with voids to isolate the ground plane from signal vias, whereby, in cross-section the ground plane and ground vias appear as a concave edge interrupted only by the signal vias at certain selected sections.

In an embodiment, the invention includes an external strata of layers wherein the thickness between the conductive patch structures (either the top circular or the bottom annular ring antenna) and the conductive ground plane determines the maximum range of the operating frequency of the corresponding bands (upper/lower band of radio frequency signal). In an embodiment, a first layer of the external strata is a second antenna patch layer and has a third surface pattern of conductive film applied as an antenna patch connected to a pair of signal vias.

In an embodiment, viewed in top view, the assembled article arranges the under and external antenna patches coaxially.

In an embodiment, the invention includes an hybrid strata of layers wherein said hybrid strata of layers comprises passive electronic devices, ground and signal vias, and conductive films providing a plurality of signal transformations. In an embodiment, the active electronic devices are mounted on the bottom side of the substrate.

Another aspect of the invention is a phased-array antenna comprising a plurality of dual frequency dual polarization antenna elements embedded within a plurality of strata of dielectric material wherein each antenna element is elevated above a ground plane.

In an embodiment, longer wavelength (lower frequency/lower band) antenna elements are annular circularly polarized antenna patches coaxially arranged with shorter wavelength (higher frequency/upper band) circularly polarized antenna patches.

Another embodiment of the invention disclosed for clarification In an embodiment an article of manufacture includes three strata of dielectric material fabricated as layers, each with voids and conductive film. The voids of the layers are filled with a highly conductive metal material.

The layers of dielectric are finally integrated into a planar multi-layer array of antenna elements after the metal films are deposited into voids and as surface patterns.

The article has an understrata of layers. Each layer of the understrata is made of dielectric material with voids for a plurality of ground vias and a plurality of signal vias.

A first layer of the understrata is a first antenna patch layer and has a first surface pattern of conductive film applied forming an annulus physically connected to a pair of signal vias.

A last layer of the understrata is the bed layer and has a second surface pattern of conductive film applied to interconnect the ground vias in a ground plane. Said ground plane has voids to isolate the ground plane from signal vias. The conductive film pattern electrically connects each signal via to the signal via in layer above it and each ground via to the ground via above it and interconnects all the ground vias into a ground plane except where the signals pass through the ground plane.

In cross-section the ground plane and ground vias appear as a concave edge interrupted only by the signal vias at certain selected sections. In embodiments, each signal via is surrounded by a shield of ground vias to isolate signals from one another and noise.

In an embodiment, the article also has an external strata of layers. Each layer of the external strata of layers is made of dielectric material with voids for a plurality of signal vias. The voids of the external strata layers are filled with a conductive film.

A first layer of the external strata is a second antenna patch layer and has a third surface pattern of conductive film applied as a circular patch antenna physically connected to a pair of signal vias.

The invention is distinguished by the arrangement of the understrata and external antenna patches coaxially in top view. The invention is distinguished by reducing the area required to provide dual band operation. The invention is distinguished by reducing the number of metal layers required for fabrication from conventional circuits.

In an embodiment, the article also has a hybrid strata of layers. The hybrid strata has at least one curtain of grounded vias and at least one ground plane to provide signal isolation.

The hybrid strata of layers contains active and passive electronic devices, ground and signal vias, and conductive films providing a plurality of signal transformations.

In an embodiment the upper band signals (shorter wavelength) are transmitted and the lower band signals (longer wavelength) are received.

In an embodiment, the array of hybrids introduce magnitude and phase values to the signals passing through the array of antenna patches which enables beam steering for signals.

Referring to FIG. 1, a phased-array antenna 100 includes an array of antenna patches and signal via shown in perspective. An array of annular ring antenna patches 141-149 have two signal via each connected. The signal via 141$p$0 141$p$9 142$p$0 142$p$9 149$p$0 149$p$9 enable circularly polarized antenna beams when connected to signals with a phase difference. Through the inner rims of the annular ring antenna patches pass two other signal via for each circular antenna patch 151 152 159. The signal via 151$p$0 151$p$9 152$p$0 152$p$9 159$p$0 159$p$9 (not drawn to scale) enables the circular antenna patches to emit circularly polarized antenna beams when connected to signals with a phase difference. Each cell of the phased-array comprises a coaxially arranged stack of one annular ring patch and one circular patch.

Figure 2A:
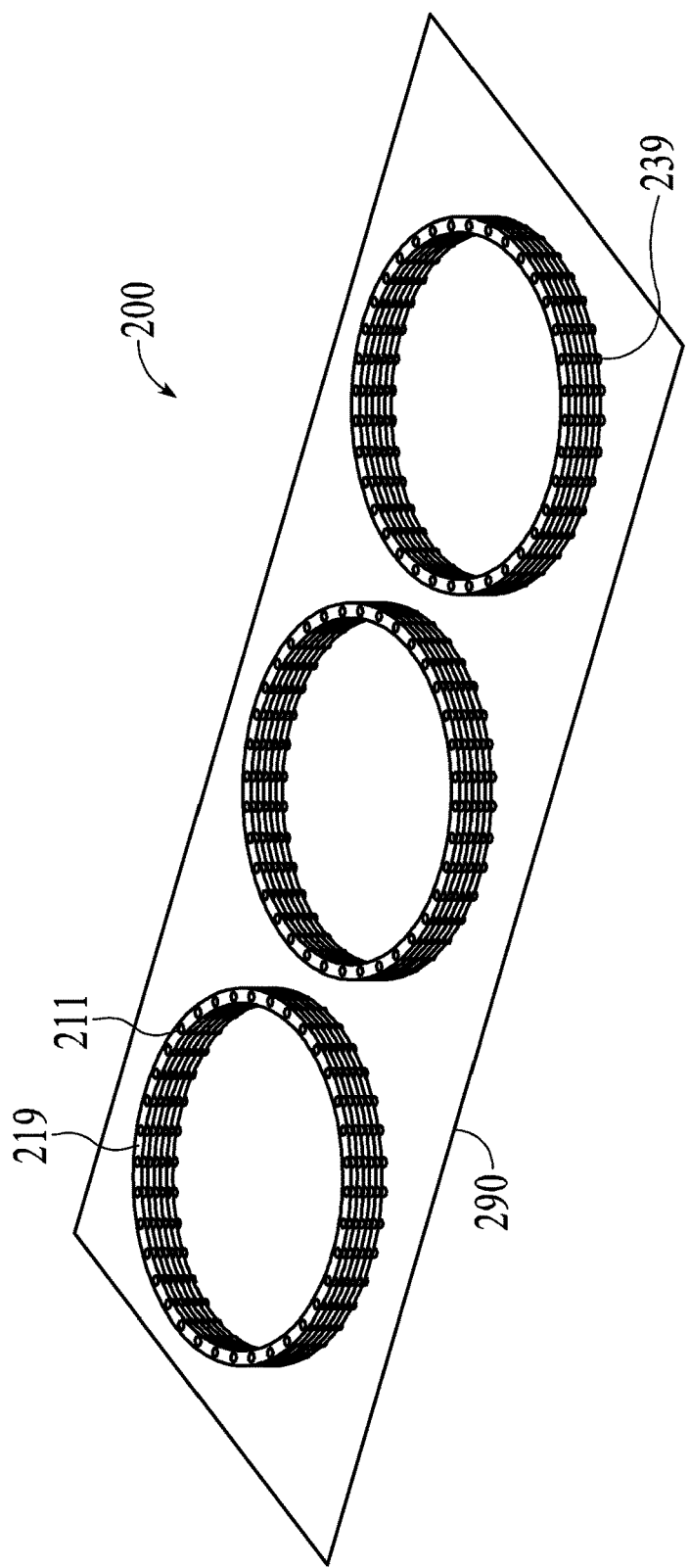

Referring to FIGS. 2A, 2B, and 2C a phased-array antenna 200 also includes a plurality of ground via fabricated by assembling layers of dielectric material in which voids have been filled by highly conductive metal material. FIG. 2A shows a plurality of via 211-239 connected to a ground plane 290 in perspective. In FIG. 2B the via are shown in top view to form several closed walls e.g. 211-219. In FIG. 2C the closely arranged via 211-219 form a ground wall 210. An array of ground wells 210 220 230 is formed by connecting a ground plane 290 to these ground walls.

Figure 3:
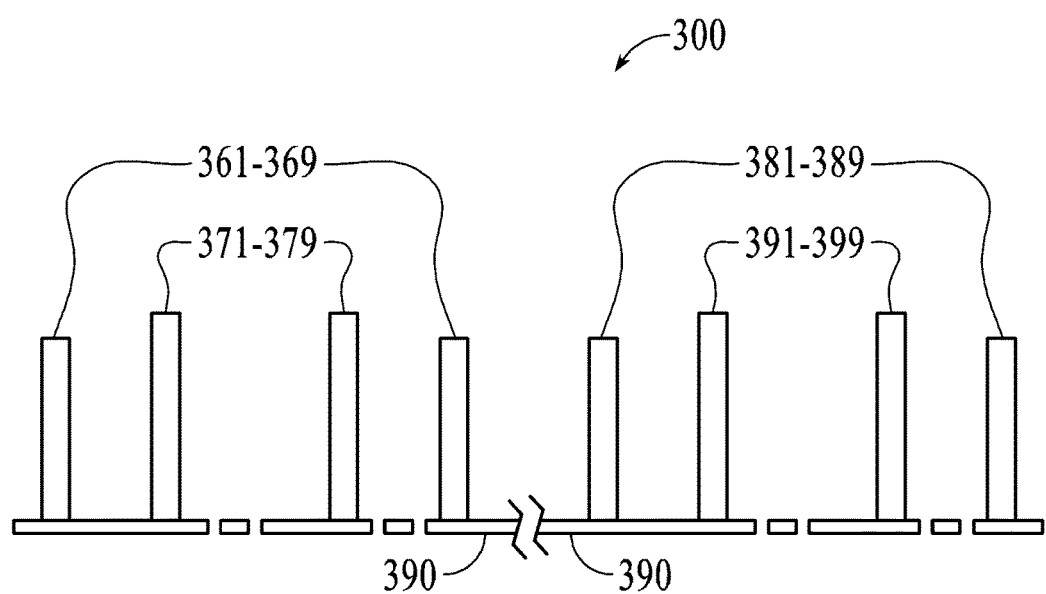
FIG. 3 is a section view of a ground plane connected to an array of outer ground walls and inner ground walls forming two double walled ground wells.

Referring to FIG. 3 an array of ground walls connected to a ground plane is illustrated 300. The ground plane 390 is shown at a section with voids for signal via to pass through. An inner ground wall of via 371-379 391-399 is placed within each outer ground wall of via 361-369 381-389. To make the figures less confusing the inner ground walls are illustrated as taller than the outer ground walls to make them more distinguishable as well as to elevate the annular antenna patch above the surrounding outer ground wall in the figures. In embodiments, the outer ground wall may also be equal to or higher than the inner ground wall. Two doublewalled ground wells are illustrated.

Figure 4A:
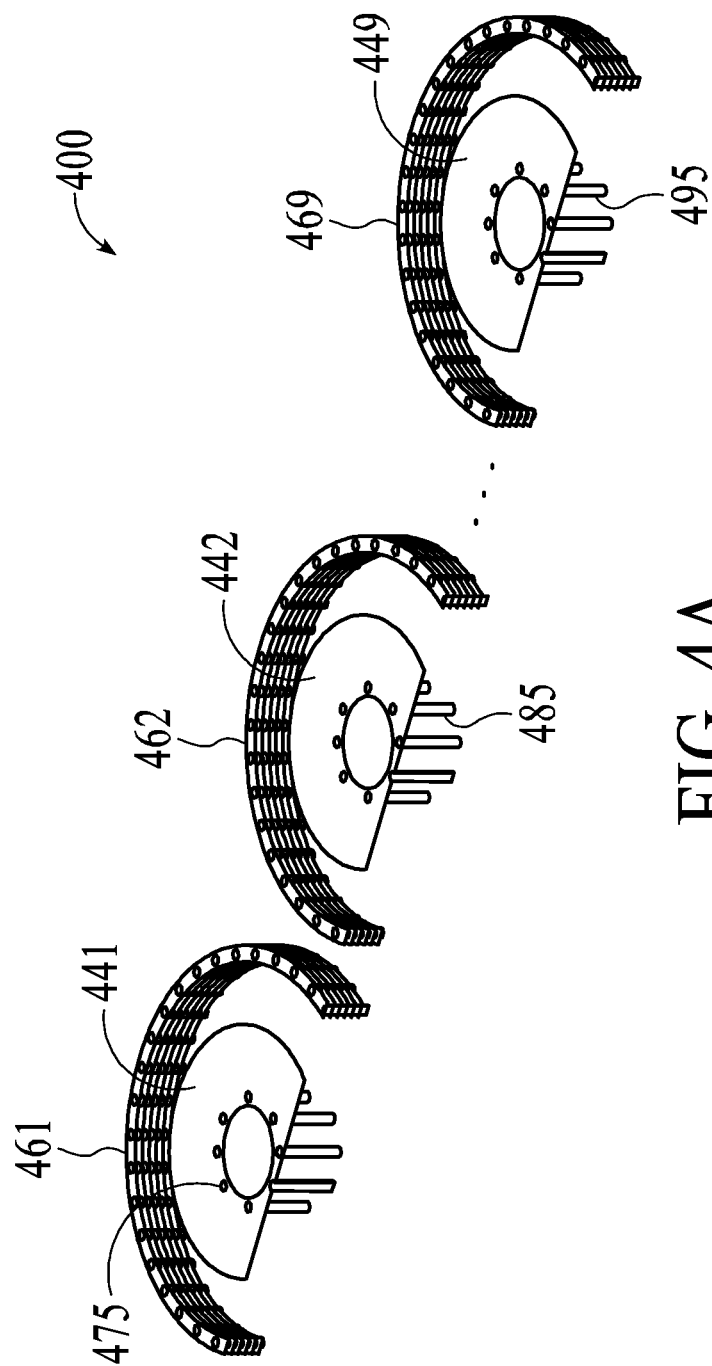
FIGS. 4A, 4B, and 4C are views of an array of double walled ground wells coupled to an array of annular ring antenna patches.
Figure 4B:
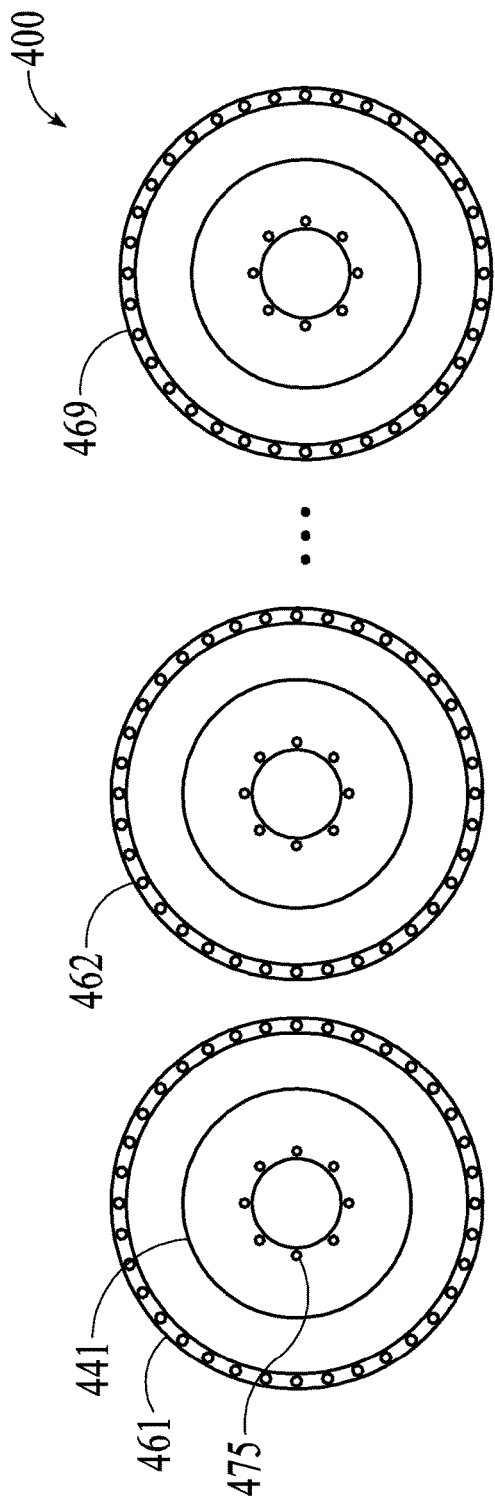
Figure 4C:
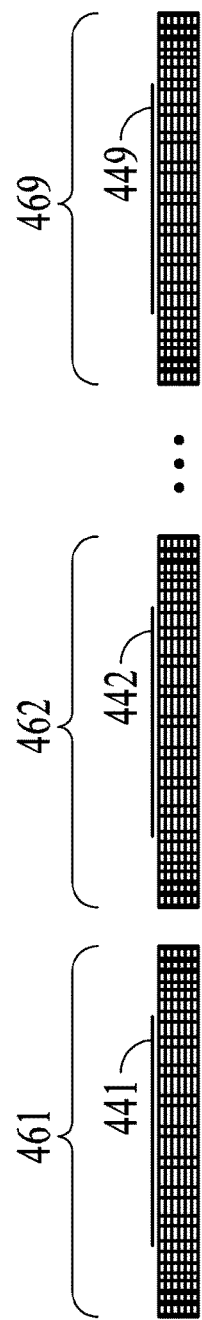

Referring to FIGS. 4A, 4B, and 4C, view 400 includes an array of annular ring antenna patches 441-469 and an array of ground walls 461-469 475 485 495 composed of via. A sectioned perspective view 4A shows the arrangement of the inner ground walls connected to the annular antenna patches near the smaller rims. The annular ring patches 441 442 449 are shorted by the inner ground well walls. A top view 4B shows the array of outer ground walls 461 462 469 and the array of annular ring antenna patches 441. Only the top of the inner ground wall at the smaller rim 475 is visible. The side view 4C shows the array of outer ground walls 461 462 and 469 and the array of annular antenna patches 441 442 449. The figures shows the array of shorted annular ring antenna 441, 442, 449 are isolated from one another by the outer ground walls 461, 462, 469.

Figure 5:
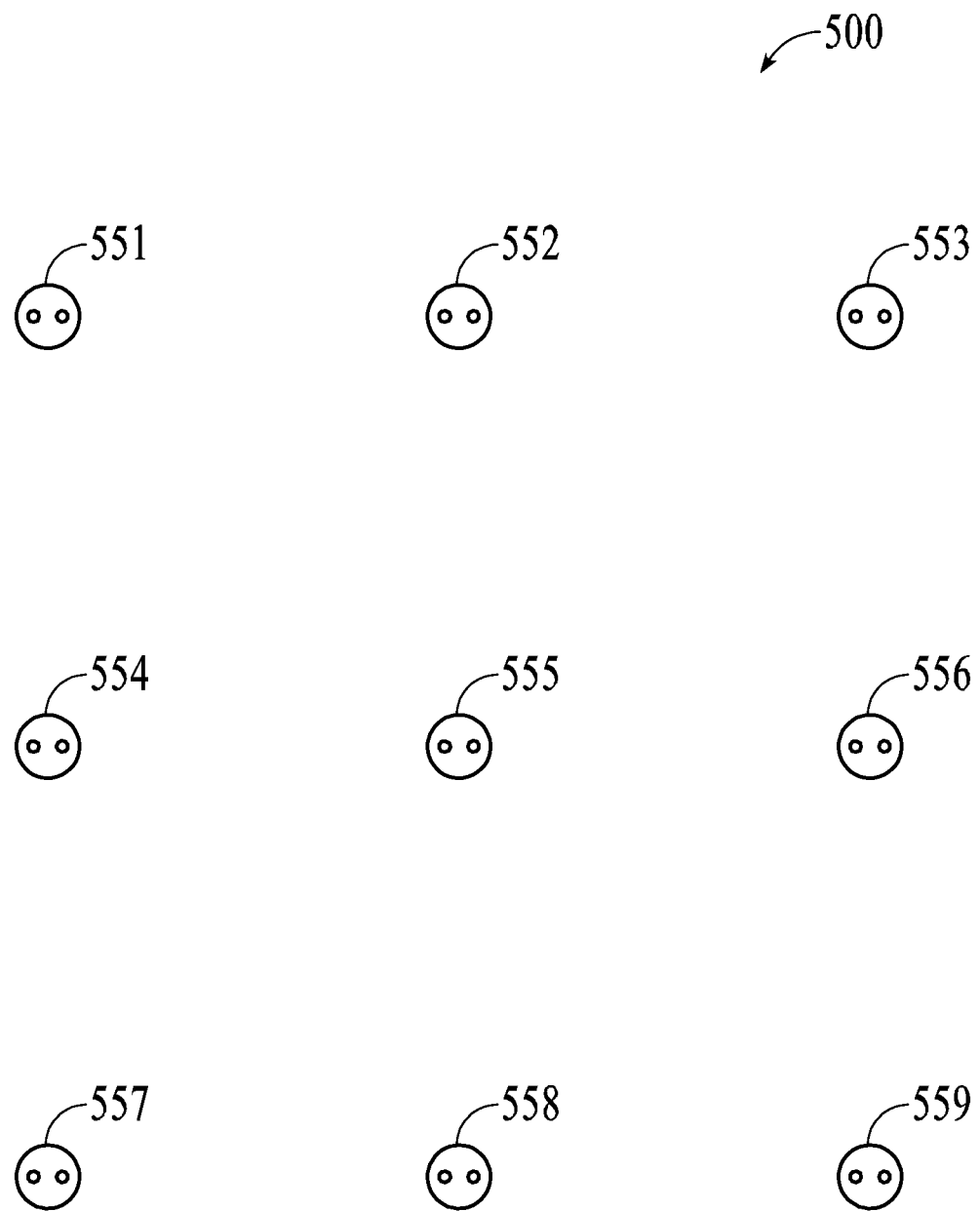
FIG. 5 is a top view of a two dimensional array of circular antenna patches.

Referring to FIG. 5, a two dimensional array 500 of circular antenna patches 551-559 is illustrated in top view. These patches are applied to a single layer of the article of manufacture before it is assembled. Below each circular antenna patch are two signal vias which when operated with different phases of a signal result in a right hand or left hand circularly polarized electro-magnetic radio wave. Additional phase control directs an antenna beam. These patches support the shorter wavelength signals of the higher operating band.

Figure 6:
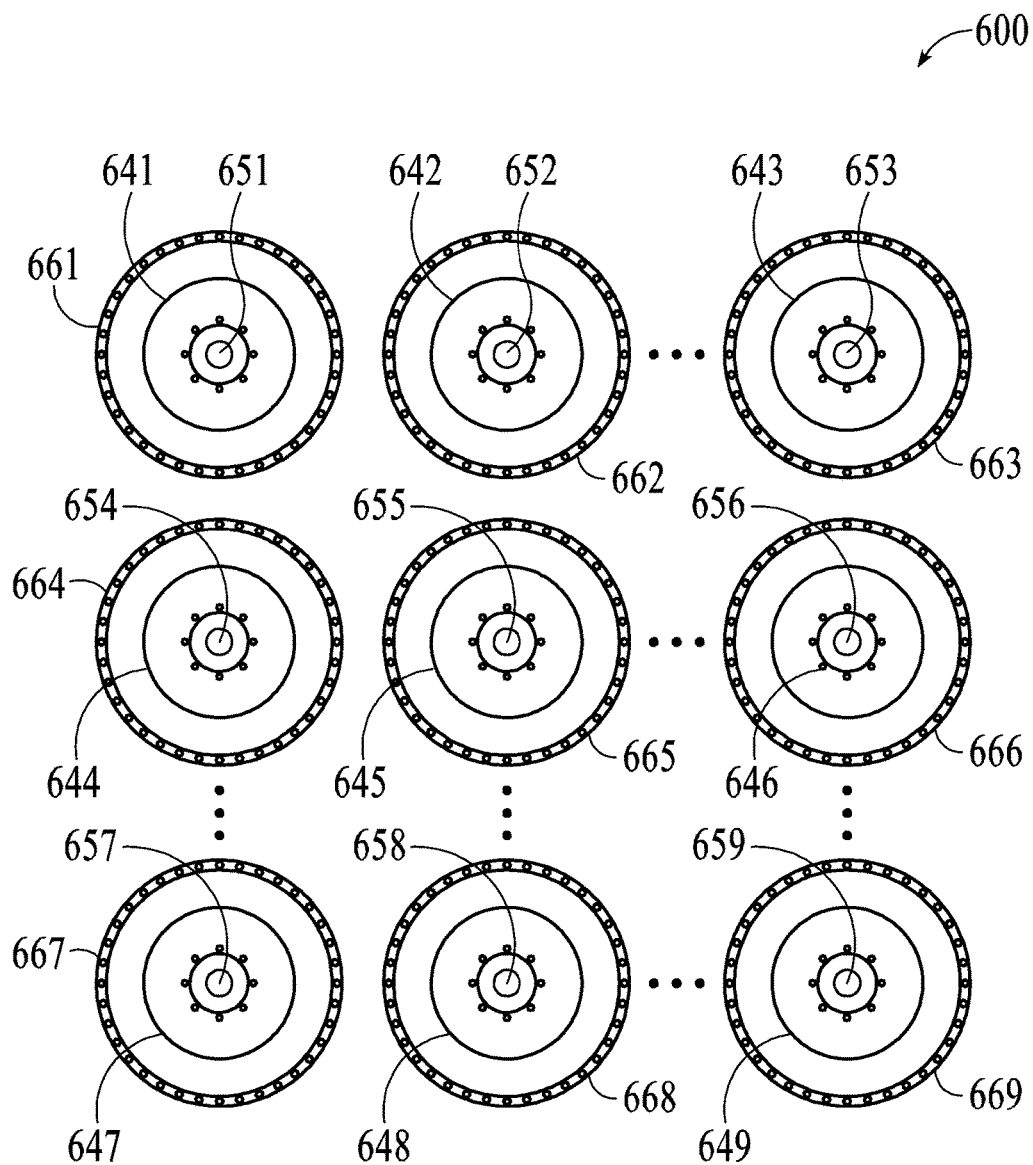
FIG. 6 is a top view of an orthogonally polarized, dual frequency co-axially stacked phased-array antenna.

Referring to FIG. 6, a two dimensional array of phase controlled antenna elements illustrated in top view 600. The elements are made up of an array of outer ground walls 661-669. Within the boundary of each outer ground wall is an annular ring antenna patch 641-649. Each annular ring antenna patch is shorted to ground at its inner rim. Co-axially arranged with each annular ring antenna patch is a circular antenna patch 651-659 (not drawn to scale, see FIG. 7). Advantageously, the area required for the circular antenna patch operating at a second frequency is within the area required for the annular antenna patch operating at a first frequency. The array of ground walls reduces interference between the elements.

Figure 7:
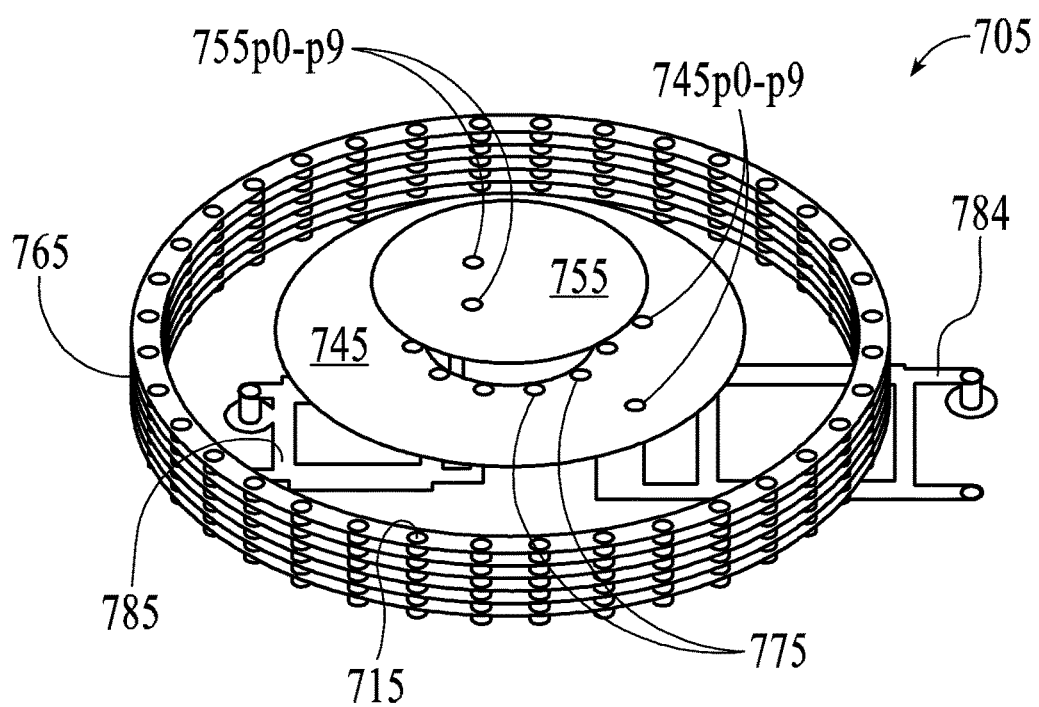
FIG. 7 is a perspective view of a single element of a orthogonally polarized, dual frequency co-axially stacked phased-array antenna.

In FIG. 7 a single element of a dual frequency dual polarized phased-array antenna is illustrated in perspective with dielectric layers, ground planes and ground walls rendered transparent with the exception of an outer ground wall 765 made up of a plurality of closely arranged via 715. The upper terminus of the inner ground wall 775 is shown to be coupled to an annular antenna patch 745 near its smaller rim. A circular antenna patch 775 is shown elevated co-axially above the annular antenna patch. Signal vias 755$p$0 755$p$9 connected to the circular antenna patch pass through the interior of the annular antenna patch. Signal vias 745$p$0 745$p$9 are connected to the annular antenna patch. All signal via are connected to leads 784 785 from the hybrid circuits that provide phase controlled signals at the two operating frequencies. The invention is distinguished by providing a steered beam by an array of antenna patches. The invention is distinguished by its compact real estate and economy by stacking a circular patch operative at a first frequency above an annular patch operative at a second frequency. The invention is distinguished by an outer ground wall for isolation of antenna elements of the array in a more compact and economical fabrication. The invention is distinguished by an inner ground wall for isolation of a first operating frequency from a second operating frequency. The invention is distinguished by providing two circular polarized signals within the same footprint.

TABLE A lists and describes the figure references:

| Reference | Description |
|---|---|
| 100 | Array of antenna patches, signal via |
| 141, 142, 149 | Annular ring patches |
| 141p0, 141p9, 142p0, 142p9, 149p0, 149p9 | Signal via to annular ring patches |
| 151p0, 151p9, 152p0, 152p9, 159p0, 159p9 | Signal via to circular patches |
| 200 | Ground plane, ground via |
| 211-219 211-239 | Ranges of ground via |
| 210, 220, 230 | Array of ground walls made of closely arranged via |
| 290 | Ground plane |
| 300 | Array of double walled ground wells |
| 361-369, 381-389 | Ranges of via of outer ground walls |
| 371-379, 391-399 | Ranges of via of inner ground walls |
| 390 | Ground plane (broken, not to scale) |
| 400 | Array of ground walls, annular patches |
| 441, 442, 449 | Annular ring patches |
| 461, 462, 469 | Outer ground walls |
| 475, 485, 495 | Inner ground walls |
| 500 | Array of circular antenna patches |
| 551-559 | Circular antenna patches with tops of signal via |
| 600 | Array of dual frequency antenna elements |
| 641-649 | Range of annular ring antenna patches (showing tops of inner ground wall via) |
| 651-659 | Range of circular antenna patches (not to scale to show tops of inner ground wall via) |
| 661-669 | Range of outer ground walls |
| 705 | An instance of a phased-array antenna element |
| 715 | Ground via of outer ground wall |
| 745 | Annular ring antenna patch |
| 745p0, 745p9 | Signal via connected to annular ring antenna patch |
| 755 | Circular antenna patch |
| 755p0, 755p9 | Signal via connected to circular antenna patch |
| 765 | Outer ground wall |
| 775 | Tops of inner ground wall via |
| 784, 785 | Signal leads to hybrid radio frequency integrated circuit ports |

CONCLUSION

The invention can be easily distinguished from the conventional dual frequency array antennas by its reduced unit size operating at dual frequency due to the stacking structure Compared to conventional dual band phased-array antennas, the stacked patch occupies less area which provides lower cost of manufacture.

Compared to conventional dual band phased-array antennas, there is less coupling between adjacent antenna elements.

Compared to conventional dual band phased-array antennas, the invention allows use of lower dielectric constant substrate while still maintaining less coupling between adjacent antenna elements.

Advantageously, the invention may be switchably operated as a transmitter or a receiver or both and switchably configured in two circular polarizations for each frequency band. The invention is distinguished by isolation of two beams at different operating frequencies and Left Hand or Right Hand circular polarization when connected to a hybrid circuit providing a signal at a first phase and at a second phase.

The integrated use of top (circular) and bottom (shorted annular ring) patch is novel for the Ka band phased array satellite communication. The organization of the via walls with the top and bottom patches provides a great performance when the substrate of low dielectric constant is required to cut the fabrication cost.

The invention can be easily distinguished from a planar inverted F antenna found in cellular phones.

A conventional planar inverted F antenna (PIFA) antenna has to have the shorting pin/via, in order to work properly. The PIFA is normally used for rectangular patch antenna and the shorting pin can reduce the size of the antenna. The feature of size reduction is very useful for the cellular phone antenna where the size is more critical parameter in antenna design. The cost of this shorting pin is the reduction of the antenna gain. However, our shorted annular ring patch has no motivation of getting a size reduction due to vias.

The invention can be easily distinguished from single feed or capacitive feed antennas. For this patent application, two feed vias use the TM11 mode to generate two linear polarization. In principle, if the two linear polarization has +90 or −90 degree phase shift, we can generate the circular polarization. The +90 degree or the −90 degree can generate the left handed circular polarization (LHCP) and right handed circular polarization (RHCP) respectively (this correspondence may be reversed depending on the choice of the feed vias). Although there are many ways to generate the circular polarization at TM11 mode with a single feed via, the dual feed vias have the advantage of achieving wider axial ratio bandwidth. The circular polarization is evaluated by the axial ratio, which means how close the magnitudes of the two orthogonal (90 degree shifted) fields are. Moreover, since our design requires the polarization (LHCP or RHCP) switching, the single feed via cannot implement the function. Single feed via design is inflexibly determined by the location of the via and the physical geometry of the patch.

The annular ring patch (the lower patch) also works in the same way as circular patch. In this patent application, we use the dual feed vias to generate two linear polarization fields with 90 degree phase shift. The +90 degree or the −90 degree can generate the left handed circular polarization (LHCP) and right handed circular polarization (RHCP) respectively (this correspondence may be reversed depending on the choice of the feed vias).

The inner arc of annular ring patch is optionally shorted to ground because the shorting vias don't affect the operation of this lower patch. It does offer better isolation of the feeding vias of upper patch. The invention is distinguished by a double-wall well.

The present invention can be easily distinguished from conventional shorted annular ring patch antennas by physical size, economy of fabrication, and provision of up to steerable beams.

The present invention can be easily distinguished from a conventional stacked annular ring antenna. In our case, we use one circular patch and one annular ring and the inner edge of our annular ring is grounded with vias to have better performance. A conventional annular ring is excited by two electromagnetically coupled traces but in our case, two physical vias are connected to the annular ring antenna. In this way, our axial ratio bandwidth is better than a conventional design. In a conventional design, the two frequencies are close so the two antennas share the same hybrid (the hollowed rectangular shaped thing). In our patent, we use two far apart frequency and two separate hybrid. Our patent has the inner shorted pins/vias to provide better isolation of the feeding signal vias and the top circular patch antenna.

I claim:

1. An article of manufacture comprising a plurality of dielectric layers having voids filled with conductive metal to form vias, and surface patterns of conductive metal film to form ground planes and patches, comprising:

a first plurality of dielectric layers having metal filled voids (ground vias) which is when assembled penetrate said first players to form a conductive circular well wall;

a metal film portion of a shorted annular ring patch antenna (SARPA) coaxially arranged within the horizontal boundary of the conductive circular well wall (well) and at the upper surface of the circular well;

a second plurality of dielectric layers having metal filled voids (signal vias) assembled above the SARPA; and a metal film portion of a circular patch antenna (CPA) on the upper surface of the second plurality dielectric layers.

2. The article of manufacture of claim 1 wherein the first plurality of dielectric layers having metal filled voids (ground vias) which when assembled penetrate said first layers to form a conductive well wall is further connected to a metal film ground plane having non-conductive voids through which signal vias pass.

3. The article of manufacture of claim 1 wherein the shorted annular ring patch antenna (SARPA) coaxially arranged within the horizontal boundary of the conductive well wall (well) and at the upper surface of the well comprises:

a first plurality of signal vias; connected to, an annular metal film.

4. The article of manufacture of claim 1 wherein a second plurality of dielectric layers having metal filed voids (signal vias) assembled above the SARPA is further connected to signal vias penetrating the first plurality of dielectric layers and through the ground plane.

5. The article of manufacture of claim 1 wherein the circular patch antenna (CPA) on the upper surface of the second plurality of dielectric layers comprises:

a second plurality of signal vias; connected to, a circular metal film surface isolated by the second plurality of layers and elevated above the metal film portion of the SARPA.

6. The article of manufacture of claim 1 further comprising a second plurality of metal filed voids in said dielectric layers which forming a second conductive well wall connects the ground plane to the edge of the shorted annular ring patch antenna which has the smaller radius.

7. The article of manufacture of claim 6 further comprising at least one hybrid coupler circuit below the ground plane connected to at least two signal leads to provide a transmit channel and a receive channel.

8. The article of manufacture of claim 6 further comprising at least one hybrid coupler circuit below the ground plain connected to at least two signal leads to provide polarized antenna beams.

9. The article of manufacture of claim 8 wherein said at least one hybrid coupler circuit is switchable to provide a left hand circular polarized beam or a right hand circular polarized beam.

10. A phased-array antenna comprising a plurality of dual frequency range dual polarization antenna elements embedded within a plurality of strata of dielectric material, a plurality of vias making a plurality of rf conductive double walled wells (well) coupled to a ground plane, and a plurality of pairs of $1^{st}$ frequency band signal vias and pairs of $2^{nd}$ frequency band signal vias; wherein antenna elements for a first frequency range are annular ring antenna patches coaxially stacked below circular antenna patches for a second frequency range, wherein said pairs of $1^{st}$ frequency band signal vias enable $1^{st}$ circular polarization and said pairs of $2^{nd}$ frequency band signal vias enable $2^{nd}$ circular polarization orthogonal to said first circular polarization, and wherein an inner wall of each well is coupled to an interior edge of said annular ring antenna patch.

\* \* \* \* \*